(12) United States Patent
Ward et al.

(10) Patent No.: US 10,283,475 B2
(45) Date of Patent: May 7, 2019

(54) POWER MODULE ASSEMBLY WITH DUAL SUBSTRATES AND REDUCED INDUCTANCE

(71) Applicant: GM GLOBAL TECHNOLOGY OPERATIONS LLC, Detroit, MI (US)

(72) Inventors: Terence G. Ward, Waterford, MI (US); Constantin C. Stancu, Auburn Hills, MI (US); Marko Jaksic, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 7 days.

(21) Appl. No.: 15/378,154

(22) Filed: Dec. 14, 2016

(65) Prior Publication Data
US 2018/0166410 A1 Jun. 14, 2018

(51) Int. Cl.
*H01L 23/00* (2006.01)
*H01L 25/00* (2006.01)
(Continued)

(52) U.S. Cl.
CPC ............ *H01L 24/27* (2013.01); *H01L 23/528* (2013.01); *H01L 23/5226* (2013.01); *H01L 23/53214* (2013.01); *H01L 23/53228* (2013.01); *H01L 24/32* (2013.01); *H01L 24/40* (2013.01); *H01L 24/73* (2013.01); *H01L 25/0655* (2013.01);
(Continued)

(58) Field of Classification Search
CPC ........... H01L 23/53228; H01L 23/5226; H01L 23/528; H01L 25/50; H01L 25/0655; H01L 24/32; H01L 2224/32151; H01L 2224/27505; H01L 2225/06527; H01L 2224/8384; H01L 2224/8484; H01L 2224/40491; H01L 2224/40227; H01L 2224/48227; H01L 2224/32227; H01L 2224/73215; H01L 2224/73265; H01L 2224/73263; H01L 2224/73221; H01L 2224/33181; H01L 2224/32245;
(Continued)

(56) References Cited

U.S. PATENT DOCUMENTS

2008/0303056 A1* 12/2008 Ward ...................... H01L 24/40
257/133
2008/0303137 A1* 12/2008 Ward ................... H01L 23/3735
257/714
(Continued)

*Primary Examiner* — Mohsen Ahmadi
*Assistant Examiner* — Scott E Bauman
(74) *Attorney, Agent, or Firm* — Quinn IP Law

(57) ABSTRACT

A power module assembly has a first substrate including a first layer, second layer and a third layer. The first layer is configured to carry a switch current flowing in a first direction. A second substrate is operatively connected to the first substrate and includes a fourth layer, fifth layer and a sixth layer. A conductive joining layer connects the third layer of the first substrate and the fourth layer of the second substrate. The conductive joining layer may be a first sintered layer. The third layer of the first substrate, the first sintered layer and the fourth layer of the second substrate are configured to function together as a unitary conducting layer carrying the switch current in a second direction substantially opposite to the first direction. The net inductance is reduced by a cancellation effect of the switch current going in opposite directions.

12 Claims, 3 Drawing Sheets

(51) Int. Cl.
*H01L 25/07* (2006.01)
*H01L 23/522* (2006.01)
*H01L 23/528* (2006.01)
*H01L 23/532* (2006.01)
*H01L 25/065* (2006.01)

(52) U.S. Cl.
CPC ............ *H01L 25/072* (2013.01); *H01L 25/50* (2013.01); *H01L 24/33* (2013.01); *H01L 24/48* (2013.01); *H01L 24/83* (2013.01); *H01L 2224/27505* (2013.01); *H01L 2224/32151* (2013.01); *H01L 2224/32227* (2013.01); *H01L 2224/32245* (2013.01); *H01L 2224/33181* (2013.01); *H01L 2224/40227* (2013.01); *H01L 2224/40491* (2013.01); *H01L 2224/48227* (2013.01); *H01L 2224/73215* (2013.01); *H01L 2224/73221* (2013.01); *H01L 2224/73263* (2013.01); *H01L 2224/73265* (2013.01); *H01L 2224/8309* (2013.01); *H01L 2224/8384* (2013.01); *H01L 2224/8484* (2013.01); *H01L 2225/06527* (2013.01); *H01L 2924/00014* (2013.01)

(58) Field of Classification Search
CPC ......... H01L 24/40; H01L 24/83; H01L 24/48; H01L 24/33; H01L 25/072
See application file for complete search history.

(56) References Cited

U.S. PATENT DOCUMENTS

| | | | |
|---|---|---|---|
| 2013/0049204 A1* | 2/2013 | Oeschler | H01L 24/29 257/772 |
| 2013/0147540 A1* | 6/2013 | Wu | H01L 27/0883 327/382 |
| 2016/0093594 A1* | 3/2016 | Funatsu | H01L 23/49844 257/784 |

* cited by examiner

POWER MODULE ASSEMBLY WITH DUAL SUBSTRATES AND REDUCED INDUCTANCE

STATEMENT REGARDING FEDERALLY-SPONSORED RESEARCH OR DEVELOPMENT

This invention was made with Government support under Agreement No. DE-EE-0007285, awarded by Department of Energy—National Energy Tech Lab (NETL). The United States Government may have certain rights in this invention.

INTRODUCTION

The present disclosure relates to a power module assembly having dual substrates and reduced inductance. Power modules having semi-conductor devices for generating power are employed in a variety of settings. For example, hybrid vehicles may utilize power modules to energize a motor/generator. It is desirable to produce a power module assembly that provides high power density while generating low parasitic inductance. The layout of an assembly impacts its ability to generate power as well as inductance.

SUMMARY

A power module assembly has a first substrate including a first layer, second layer and a third layer, the first layer and the third layer being electrically conductive. The first layer is configured to carry a switch current flowing in a first direction. The second layer is an electrically insulating layer positioned between and configured to electrically isolate the first and the third layers. A second substrate is operatively connected to the first substrate and includes a fourth layer, fifth layer and a sixth layer. The fourth layer and the sixth layer are configured to be electrically conductive. The fifth layer is an electrically insulating layer positioned between and configured to electrically isolate the fourth and the sixth layer. A conductive joining layer connects the third layer of the first substrate and the fourth layer of the second substrate. The third layer of the first substrate, the conductive joining layer and the fourth layer of the second substrate are configured to function together as a unitary conducting layer carrying the switch current in a second direction substantially opposite to the first direction. Stated differently, the net inductance is reduced by a cancellation effect of the switch current going in opposite directions in the first layer and the unitary conducting layer.

The conductive joining layer may be a first sintered layer configured to join the first and second substrates. A method of forming the assembly includes producing the first sintered layer via a sintering process. The sintering process includes urging micro particles of a predefined metal to coalesce into a solid form via heating at a predetermined temperature for a predetermined time. The sintering process may include compressing the micro particles of the predefined metal between the first and second substrates at a predefined pressure.

The assembly is configured to support high switching frequency operation of semiconductor devices and to provide high power density with low parasitic inductance. The layout of the assembly enables a low inductance commutation path, which is achieved by using the unitary conducting layer as a return path for the switch current.

The first layer, the third layer, the fourth and the sixth layer may each be composed of at least one of aluminum and copper. The second and the fifth layers may be composed of at least one of silicon nitride, aluminum nitride and aluminum oxide. The first sintered layer may be composed of silver.

The assembly includes a first semi-conductor stack operatively connected to the first layer at a first junction. A first outer member is operatively connected to the first layer at a second junction. A second semi-conductor stack is operatively connected to the first layer at a third junction. A second outer member is operatively connected to the fourth layer at a fourth junction.

The first and second outer members have respective first, second and third sections, the respective first and third sections being substantially parallel. The respective second sections may be substantially perpendicular to the respective first and third sections. The first outer member may have a first plurality of fingers separated by respective gaps. The second outer member may have a second plurality of fingers separated by respective gaps.

The assembly may include a first terminal operatively connected to the first substrate and a second terminal operatively connected to the second substrate. The switch current defines a switching loop between the first and second terminals. The switching loop is configured to extend: from the first terminal to the first layer; from the first layer to the first semi-conductor stack at the first junction; and from the first semi-conductor stack to the first outer member. The switching loop is configured to further extend: from the first outer member to the first layer at the second junction; from the first layer to the second semi-conductor stack at the third junction; from the second semi-conductor stack to the second outer member; from the second outer member to the unitary conducting layer at the fourth junction; and from the unitary conducting layer to the second terminal.

The first semi-conductor stack may include a first semi-conductor device, a first metal layer, and a second metal layer. The first semi-conductor device is sandwiched between the first and second metal layers. A second sintered layer may be positioned between the first metal layer and the first semi-conductor device. A third sintered layer may be positioned between the second metal layer and the first semi-conductor device. The first semi-conductor stack further includes: a fourth sintered layer positioned between the first outer member and the first metal layer. A fifth sintered layer may be positioned between the second metal layer and the first layer of the first substrate.

The second semi-conductor stack may include a second semi-conductor device a first metal layer, and a second metal layer. The second semi-conductor device is sandwiched between the first and second metal layers. A second sintered layer may be positioned between the first metal layer and the second semi-conductor device. A third sintered layer may be positioned between the second metal layer and the second semi-conductor device. The first semi-conductor stack further includes: a fourth sintered layer positioned between the first outer member and the first metal layer. A fifth sintered layer may be positioned between the second metal layer and the first layer of the first substrate.

The assembly may include at least one flexible structure operatively connected to the first layer and configured to provide relatively low inductance for a (gate) control loop. The flexible structure has a plurality of co-extending layers, including a first gate layer, a second source layer and a third drain layer. The first gate layer, the second source layer and the third drain layer are electrically isolated from one another. The first gate layer and the second source layer are configured such that a gate current flows in the first gate layer in a third direction and a source current flows in the second source layer in a fourth direction, at least partially defining a control loop. The fourth direction may be substantially opposite to the third direction.

The switch current defines a switching loop through a first reference plane. The gate current and the source current define a control loop in a second reference plane. The first reference plane may be perpendicular to the second reference plane. A respective width of the third drain layer in the flexible structure may be substantially less than the respective widths of the first gate layer and the second source layer. This substantially reduces the capacitive coupling between the first gate layer and the third drain layer in the measurement loop.

The assembly may be configured to support operation at high switching frequencies. In one non-limiting example, the high switching frequency is at least 75 kHz. The operation at high frequencies is beneficial to the overall system design as it allows a reduction in volume, mass and size. The power module assembly is designed to incorporate wide band-gap semiconductor devices, which reduces the associated device energy losses.

The above features and advantages and other features and advantages of the present disclosure are readily apparent from the following detailed description of the best modes for carrying out the disclosure when taken in connection with the accompanying drawings.

DETAILED DESCRIPTION

Figure 1:
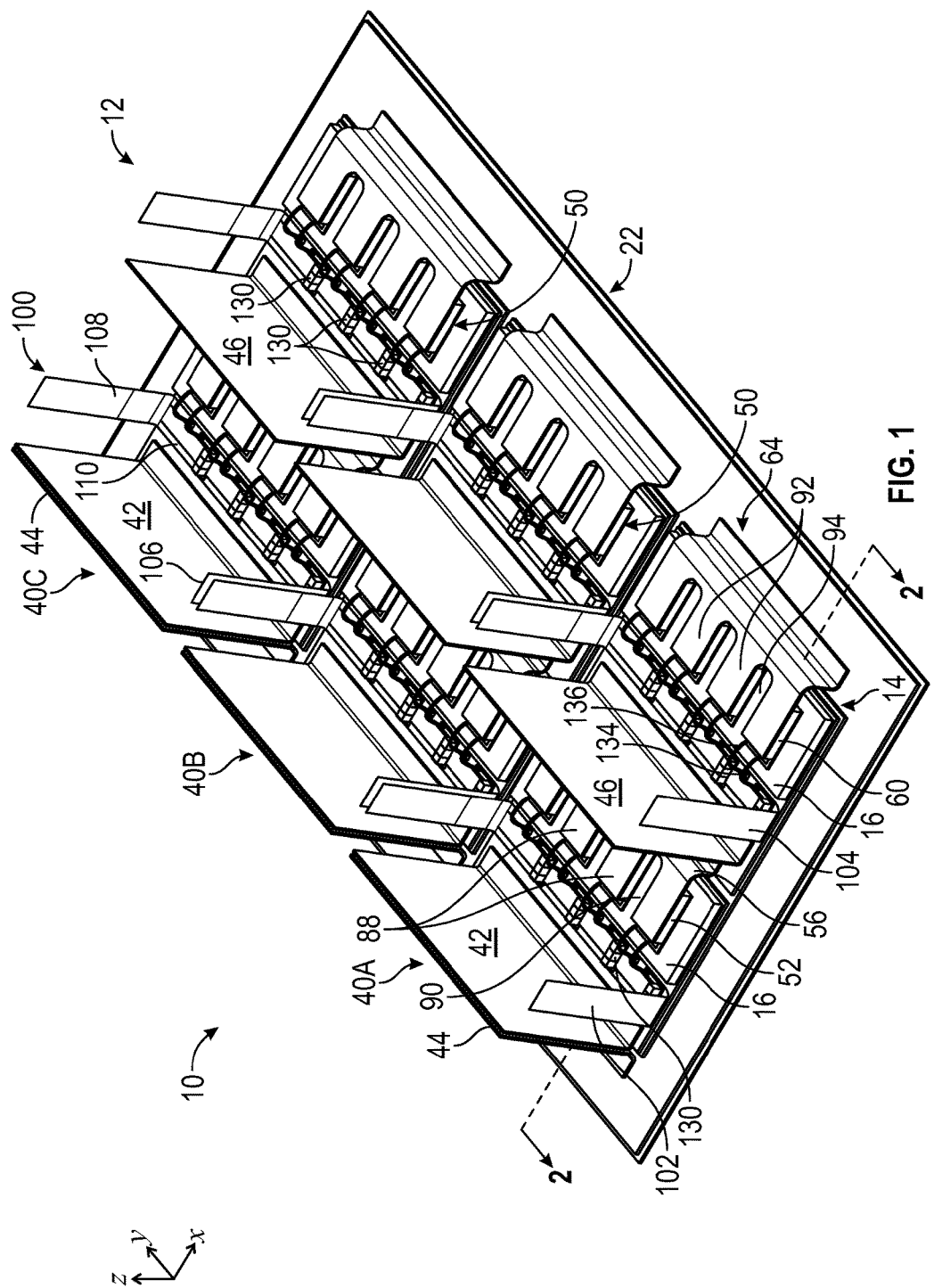
FIG. 1 is a schematic perspective view of a power module assembly.
Figure 2:
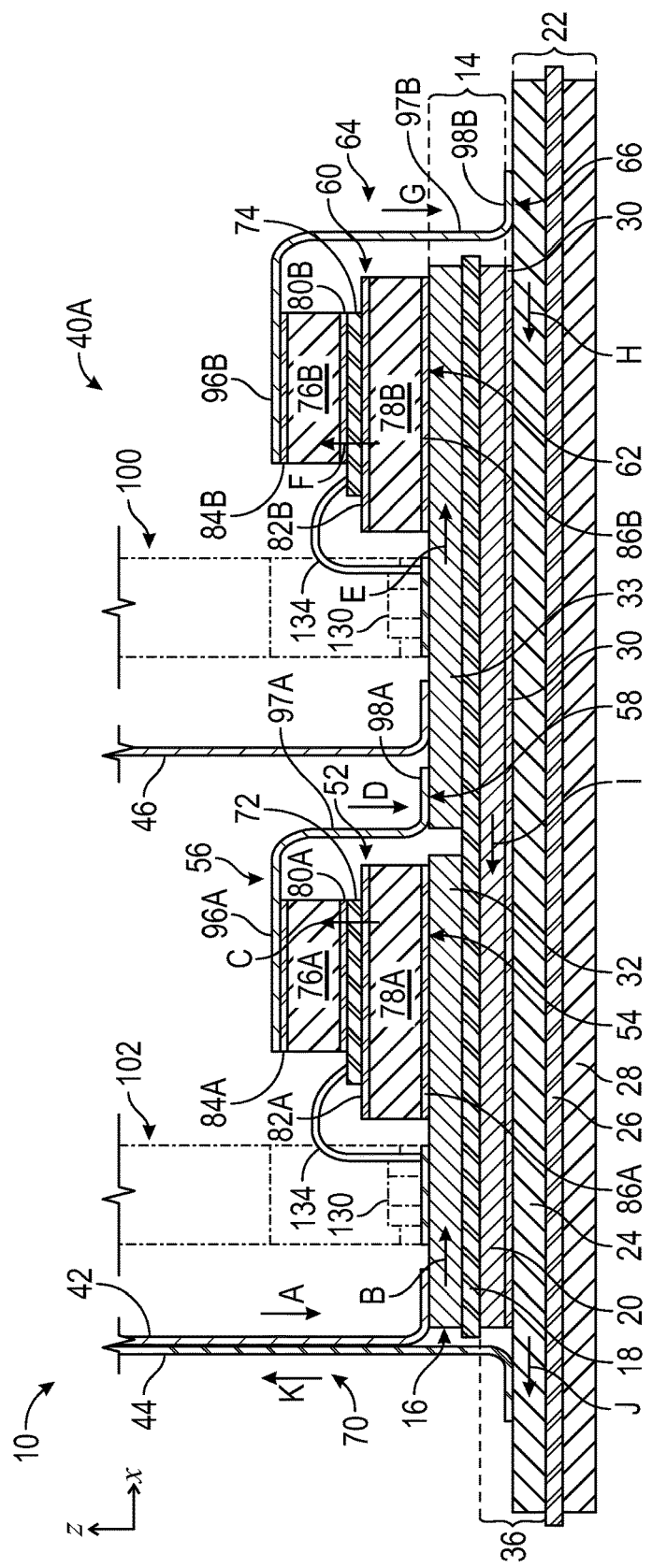
FIG. 2 is a schematic sectional view of the assembly shown in FIG. 1, through axis 2-2.

Referring to the drawings, wherein like reference numbers refer to like components, FIG. 1 schematically illustrates a power module assembly 10. FIG. 2 is a schematic sectional view of the assembly 10. The assembly 10 may be employed to power one or more components of a device 12. The device 12 may be a mobile platform, such as, but not limited to, standard passenger car, sport utility vehicle, light truck, heavy duty vehicle, ATV, minivan, bus, transit vehicle, bicycle, robot, farm implement, sports-related equipment, boat, plane, train or other transportation device. The device 12 may take many different forms and include multiple and/or alternate components and facilities. It is to be understood that the figures are not drawn to scale.

Referring to FIGS. 1-2, the assembly 10 includes a first substrate 14 operatively connected to a second substrate 22. Referring to FIG. 2, the first substrate 14 includes a first layer 16, a second layer 18 and a third layer 20. The first layer 16 and the third layer 20 are configured to be electrically conductive. The second layer 18 is an electrically insulating layer positioned between and configured to electrically isolate the first and the third layers 16, 20. Referring to FIG. 2, the second substrate 22 includes a fourth layer 24, a fifth layer 26 and a sixth layer 28. The fourth layer 24 and the sixth layer 28 are configured to be electrically conductive. The fifth layer 26 is an electrically insulating layer positioned between and configured to electrically isolate the fourth and sixth layers 24, 28.

The first layer 16, the third layer 20, the fourth layer 24 and the sixth layer 28 may each be composed of a conductor of electricity, including but not limited to, aluminum, copper, steel and various combinations of alloys, and may be in the form of wire bonds, ribbons or straps. The second and fifth layers 18, 26 may each be composed of an electrical insulator, including but not limited to, aluminum nitride, aluminum oxide or silicon nitride.

Referring to FIG. 2, the third layer 20 of the first substrate 14 and the fourth layer 24 of the second substrate 22 are connected through a conductive joining layer 30. The conductive joining layer 30, referred to herein as a first sintered layer 30, may be formed via a sintering process which includes urging micro particles of a predefined metal to coalesce into a solid form via heating at a predetermined temperature for a predetermined time. The predefined metal may be silver. For example, the micro particles of the predefined metal may be placed in an oven at 300 Celsius for one hour, between the first and second substrates 14, 22. The sintering process may include compressing the micro particles of the predefined metal between the first and second substrates 14, 22 at a predefined pressure. The sintering process may be carried out in a vacuum to avoid undesirable reactions with air/oxygen. The sintering process makes the powdery micro particles coalesce or diffuse into a solid or porous mass by heating, without liquefaction. The first sintered layer 30 has a relatively high melting point compared to a layer that is soldered on. In one example, the melting point of the first sintered layer 30 is 900 degrees Celsius.

Referring to FIG. 2, the first layer 16 includes a first portion 32 and a second portion 33, each having a respective circuit pattern that is etched or otherwise affixed onto it. The first layer 16 is configured to carry a switch current flowing in a first direction (indicated by arrow B). The third layer 20 of the first substrate 14, the first sintered layer 30 and the fourth layer 24 of the second substrate 22 are configured to function together as a unitary conducting layer 36 carrying the switch current in a return path in a second direction (indicated by arrows H, I and J) substantially opposite to the first direction (arrow B), thereby reducing an inductance of the assembly 10.

Stated differently, the net inductance is reduced by a cancellation of the magnetic field effect of the switch current going in opposite directions in the first layer 16 and the unitary conducting layer 36. The electrical return path in the unitary conducting layer 36 enables a low inductance commutation path, yielding a substantial reduction in electric parasitic inductance. The assembly 10 is configured to support high switching frequency operation and to provide high power density with low parasitic inductance.

Referring to FIG. 1, the assembly 10 may be sub-divided into a plurality of sub-modules, such as sub-modules 40A, 40B, 40C. FIG. 2 is a schematic sectional view of the assembly 10, showing the sub-module 40A. Referring to FIG. 1, each sub-module 40A-C includes a first terminal 42 (which may be positive or negative) and a second terminal 44 (which may be negative or positive). The first terminal 42 is of opposite polarity relative to the second terminal 44. The first and second terminals 42, 44 may be composed of copper sheets. Each sub-module 40A-C includes a respective output node 46 for transferring the signal out to a component of the device 12.

Each of the sub-modules 40A-C includes a plurality of semi-conductor devices 50, arranged in stacks ("plurality of" is henceforth omitted). Referring to FIG. 1, each of the sub-modules 40A-C includes eight semi-conductor devices 50 each, however, the number may be varied according to the application at hand. It is to be noted that having dual substrates (first and second substrates 14, 22) allows the assembly 10 to have twice the thermal mass and greater thickness. A greater thickness allows for greater thermal spreading, lowering the junction temperature of the plurality of semiconductor devices 50 in the assembly 10 (described below). Referring to FIG. 2, each of the first, second, third, fourth, fifth and sixth layers 16, 18, 20, 24, 26, 28 are configured to be thermally conducting such that heat from the first layer 16 is conducted to the sixth layer 28, via each of the intermediate layers. The sixth layer 28 is configured to dissipate the heat to a cooling medium (not shown).

Referring to FIG. 2, the first sub-module 40A includes a first semi-conductor stack 52 operatively connected to the first layer 16 at a first junction 54. In the embodiment shown in FIG. 1, each of the sub-modules 40A-C include two stacks each, however, the number may be varied. A first outer member 56 is operatively connected to the first layer 16 at a second junction 58. Continuing to refer to FIG. 2, a second semi-conductor stack 60 is operatively connected to the first layer 16 at a third junction 62. A second outer member 64 is operatively connected to the fourth layer 24 at a fourth junction 66.

Referring to FIG. 2, the switch current defines a switching loop 70 (see arrows A through K) between the first and second terminals 42, 44. The switching loop 70 is configured to extend: from the first terminal 42 (see arrow A) to the first layer 16 (see arrow B); from the first layer 16 to the first semi-conductor stack 52 at the first junction 54; and from the first semi-conductor stack 52 to the first outer member 56 (see arrow C). The switching loop 70 further extends: from the first outer member 56 to the first layer 16 at the second junction 58 (see arrow D); from the first layer 16 (see arrow E) to the second semi-conductor stack 60 at the third junction 62; from the second semi-conductor stack 60 to the second outer member 64 (see arrow F). The switching loop 70 further extends: from the second outer member 64 (see arrow G) to the unitary conducting layer 36 at the fourth junction 66; and from the unitary conducting layer 36 (see arrows H, I and J) to the second terminal 44 (see arrow K). The switching loop 70 is configured to extend through a first reference plane (the X-Z plane) in the embodiment shown.

Referring to FIG. 2, the first semi-conductor stack 52 includes a first semi-conductor device 72. Similarly, the second semi-conductor stack 60 includes a second semi-conductor device 74. The first and second semi-conductor devices 72, 74 may be composed of a semiconductor wafer, such as a silicon wafer. The first and second semi-conductor devices 72, 74 may include, but are not limited to: wide-band gap devices such as Metal Oxide Semiconductor Field Effect Transistors (MOSFET) used for amplifying or switching electronic signals, Vertical Junction Field Effect Transistors (VJFET), Insulated Gate Bipolar Transistors (IGBT) or other devices employed by those skilled in the art.

Referring to FIG. 2, the first semi-conductor device 72 may be sandwiched (or operatively positioned) between a first metal layer 76A and a second metal layer 78A. One of the opposing sides of the first semi-conductor device 72 may be connected to the first metal layer 76A via a second sintered layer 80A, formed by the sintering process described above. The other opposing side of the first semi-conductor device 72 may be connected to the second metal layer 78A via a third sintered layer 82A, also formed by the sintering process described above. The first semi-conductor stack 52 further includes: a fourth sintered layer 84A positioned between the first outer member 56 and the first metal layer 76A. A fifth sintered layer 86A may be positioned between the second metal layer 78A and the first layer 16 of the first substrate 14.

Similarly, referring to FIG. 2, the second semi-conductor device 74 may be sandwiched (or operatively positioned) between a first metal layer 76B and a second metal layer 78B. One of the opposing sides of the second semi-conductor device 74 may be connected to the first metal layer 76B via a second sintered layer 80B, formed by the sintering process described above. The other opposing side of the second semi-conductor device 74 may be connected to the second metal layer 78B via a third sintered layer 82B, also formed by the sintering process described above. The second semi-conductor stack 60 further includes: a fourth sintered layer 84B positioned between the second outer member 64 and the first metal layer 76B. A fifth sintered layer 86B may be positioned between the second metal layer 78B and the first layer 16 of the first substrate 14.

Each of the second, third, fourth and fifth sintered layers 80A-B, 82A-B, 84A-B, 86A-B may be composed of silver. The layout described above improves heat transfer from the first and second semiconductor devices 72, 74 to a coolant (not shown). However, the first and second semi-conductor devices 72, 74 may be packaged or metallized in other ways employed by those skilled in the art.

Referring to FIG. 2, the first outer member 56 is configured to electrically connect the first semi-conductor device 72 (via the fourth sintered layer 84A) to the first layer 16. A second outer member 64 is configured to electrically connect the second semi-conductor device 74 (via the fourth sintered layer 84B) to the second substrate 22. The first and second outer members 56, 64 may each be composed of a conductor of electricity, including but not limited to, aluminum, copper, steel and various combinations of alloys, and may be in the form of wires, ribbons or straps. In addition to electrical connectivity as discussed above, the first and second outer members 56, 64 provide a path to extract heat out of the first and second semi-conductor devices 72, 74, thereby improving the overall thermal performance of the assembly 10.

Referring to FIG. 1, the first outer member 56 may have a first plurality of fingers 88 separated by respective gaps 90. Referring to FIG. 1, the second outer member 64 may have a second plurality of fingers 92 separated by respective gaps 94. Each of the first and second plurality of fingers 88, 92 is positioned above one of the semi-conductor devices 50. Referring to FIG. 2, the first and second outer members 56, 64 have respective first, second and third sections, 96A-B, 97A-B and 98A-B. For the first outer member 56: the respective first and third sections 96A, 98A may be substantially parallel, while the respective second section 97A may be substantially perpendicular to the respective first and third sections 96A, 98A. For the second outer member 64: the respective first and third sections 96B, 98B may be substantially parallel, while the respective second section 97B may be substantially perpendicular to the respective first and third sections 96B, 98B.

Figure 3:
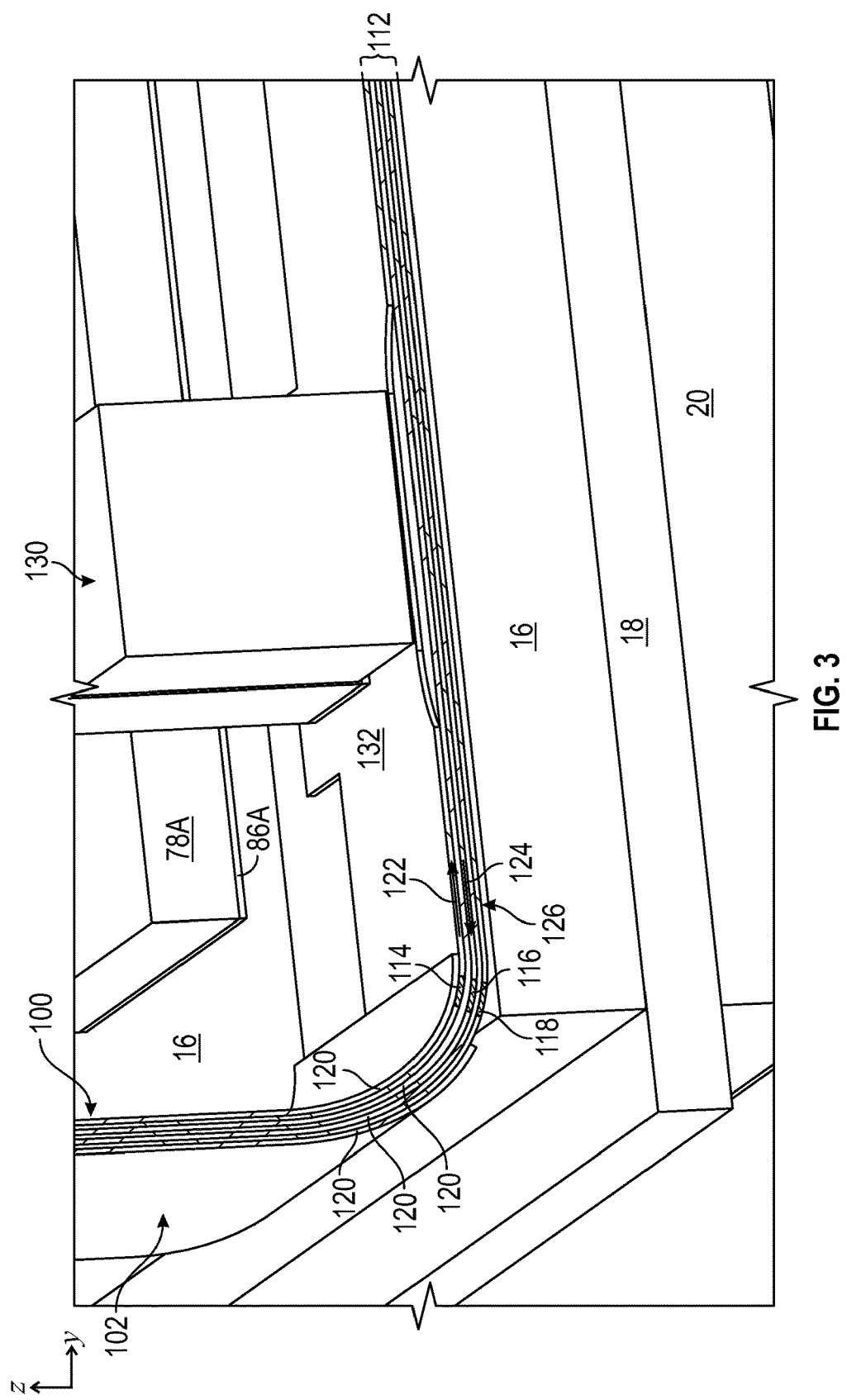
FIG. 3 is a schematic perspective of a portion of the assembly shown in FIG. 1.

Referring to FIGS. 1-3, the assembly 10 may include one or more flexible structures 100 operatively connected to the first layer 16. Referring to FIG. 1, the sub-module 40A includes first and second flexible structures 102, 104. While each of the sub-modules 40A-C in FIG. 1 have two flexible structures 100 each, other suitable configurations may be employed. The flexible structure 100 may be directly connected to the first substrate 14 in relatively close proximity to the plurality of semi-conductor devices 50, enabling precise characterization of a drain to source switch voltage. Other configurations used by those skilled in the art may be employed.

Referring to FIG. 1, each flexible structure 100 includes first and second side portions 106, 108 (parallel to the Z axis in the embodiment shown) and a base portion 110 (parallel to the Y axis in the embodiment shown), with the base portion being between the two side connections. The first and second side portions 106, 108 allow the flexible structure 100 to have two physical connections to a gate driver (not shown), reducing the control loop 126 (described below) by half.

Referring to FIG. 3, the flexible structure 100 has a plurality of co-extending layers 112, including a first gate layer 114, a second source layer 116 and a third drain layer 118. The first gate layer 114, the second source layer 116 and the third drain layer 118 are positioned in relatively close proximity to one another and are electrically isolated from one another via relatively thin insulating polymers 120. The first gate layer 114, the second source layer 116 and the third drain layer 118 include conductive circuit patterns affixed onto and are configured to be relatively wide and relatively short. The conductive circuit patterns can be formed by etching metal foil cladding (such as copper) from polymer bases, plating metal, printing of conductive inks and other processes employed by those skilled in the art.

In order to support high switching speeds of semiconductor devices 50, the assembly 10 may be employed for a gate source loop, referred to herein as a control loop 126. The first gate layer 114 and the second source layer 116 are configured such that a gate current flows in the first gate layer 114 in a third direction 122 and a source current flows in the second source layer 116 in a fourth direction 124, collectively defining the control loop 126. The fourth direction 124 may be substantially opposite to the third direction 122, enabling the parasitic inductance in the control loop 126 to be minimized via current cancellation. The ringing of the control gate source voltage is minimized, enabling faster slew rates and operation at increased switching frequencies.

As described above with reference to FIG. 2, the switch current defines a switching loop 70 configured to extend through a first reference plane (the X-Z plane in the embodiment shown). Referring to FIG. 3, the control loop 126 is configured to extend through a second reference plane (the Y-Z plane in the embodiment shown). The switching loop 70 (FIG. 2) and the control loop 126 (FIG. 3) are configured to be orthogonal, thereby minimizing magnetic cross-coupling. In other words, the first reference plane (X-Z plane) is perpendicular to the second reference plane (Y-Z). This prevents unwanted control loop action triggered by high current velocity (di/dt) slew rates coming from the switching loop 70.

The first gate layer 114 and the second source layer 116 are tightly coupled, yielding a low inductance for the control loop 126. Similarly, the second source layer 116 and the third drain layer 118 are tightly coupled, effectively reducing inductance of the measurement loop. The assembly 10 has the technical advantage that the control loop 126 will not pick up noise when high switching occurs in the semiconductor devices 50, enabling the use of fast switching devices at their full speed. Additionally, fast switching of the semiconductor devices 50 reduces switching losses, increasing the overall efficiency of the assembly 10. Moreover, the low inductance design of the switching loop 70 ensures that voltage overshoot in the semiconductor devices 50 remains low when high current velocity (di/dt) switching occurs.

Referring to FIGS. 1-3, a plurality of gate resistors 130 may be integrated directly on each of the flexible structures 100. The gate resistors 130 control the turn-on and turn-off slew rate of the semiconductor devices 50. Positioning the gate resistors 130 directly on the flexible structure 100 reduces the overall size of the control loop 126, reducing its inductance. The assembly 10 may include a plurality of metallization pads at various junctures, such as metallization pad 132 shown in FIG. 3, to electrically connect the gate resistor 130 to the gate layer 114. Referring to FIG. 1, each of the semi-conductor devices 50 may be operatively connected to the first gate layer 114 and the second source layer 116 of one of the flexible structures 100, via first and second wire bonds 134, 136, respectively. The first and second wire bonds 134, 136 may be positioned adjacent to the output node 46 (see FIG. 2).

Referring to FIGS. 1-2, the first flexible structure 102 is placed on the opposite side of the first semi-conductor stack 52 as the first outer member 56. Referring to FIG. 1, the second flexible structure 104 is placed on the opposite side of the second semi-conductor stack 60 as the second outer member 64. This provides the technical advantage of reducing the size and length of the material needed for the first and second outer members 56, 64. In addition, the area and volume below the first and second outer members 56, 64 are also reduced, reducing parasitic inductance. The flexible structure 100 may be positioned in close proximity to the first semi-conductor device 72. For example, the flexible structure 100 may be positioned between about 1 mm and 2 mm away from the first semi-conductor device 72. This provides the technical advantage of keeping both switching and control loop inductances low.

Additionally, the flexible structures 100 may be positioned between the semi-conductor devices 50 and the first and second terminals 42, 44 to minimize impact on the inductance of the switching loop 70. Placing the flexible structure 100 in between the semi-conductor devices 50 and the terminals 42, 44 reduces the control loop inductance as the length of the flexible structure 100 is kept low and distance between the flexible structure 100 and semiconductor devices 50 is minimized. Additionally, it does not interfere with the switch current path, allowing wide conduction path for the switch current that reduces the switching loop inductance.

As noted above, the FIGS. are not drawn to scale. A respective width of the third drain layer 118 in the flexible structure 100 may be substantially less than the respective widths of the first gate layer 114 and the second source layer 116. For example, the respective width of the third drain layer 118 may be about 10 times less than the respective widths of the first gate layer 114 and the second source layer 116. This substantially reduces the capacitive coupling between the first gate layer 114 and the third drain layer 118 in the measurement loop.

In summary, the assembly 10 provides a power module with significantly reduced inductances of the control loop 126 and switching loop 70, enabling fast switching control of semiconductor devices 50, such as wide-band gap devices. The assembly 10 may be capable of conducting a relatively large amount of waste heat that is dissipated from fast switching and conducting an IGBT or MOSFET, for example, with heat flux densities greater than 50 Watts per $cm^2$.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or more desired characteristics from other embodiments, resulting in other embodiments not described in words or by reference to the drawings. Accordingly, such other embodiments fall within the framework of the scope of the appended claims.

What is claimed is:

1. A power module assembly comprising:
a first substrate including a first layer, second layer and a third layer, the first layer and the third layer being electrically conductive;
wherein the first layer is configured to carry a switch current flowing in a first direction;
wherein the second layer is an electrically insulating layer positioned between and configured to electrically isolate the first and the third layers;
a second substrate operatively connected to the first substrate and including a fourth layer, fifth layer and a sixth layer, the fourth layer and the sixth layer being electrically conductive;
wherein the fifth layer is an electrically insulating layer positioned between and configured to electrically isolate the fourth and the sixth layers;
a conductive joining layer connecting the third layer of the first substrate and the fourth layer of the second substrate;
a first semi-conductor stack operatively connected to the first layer at a first junction and a second semi-conductor stack operatively connected to the first layer at a third junction, such that the switch current flows from the first semi-conductor stack to the second semi-conductor stack;
an adjacent set of terminals, including a first terminal operatively connected to the first substrate and a second terminal operatively connected to the second substrate, the first terminal being adjacent to the second terminal;
a first flexible structure, a second flexible structure and an output node operatively connected to the first layer;
wherein the first flexible structure is positioned between the first semi-conductor stack and the adjacent set of terminals, and the second flexible structure is positioned between the second semi-conductor stack and the output node; and
wherein the third layer of the first substrate, the conductive joining layer and the fourth layer of the second substrate are configured to function together as a unitary conducting layer carrying the switch current in a second direction, the second direction being opposite to the first direction.

2. The assembly of claim 1, wherein:
the conductive joining layer is a first sintered layer configured to join the first and second substrates via a sintering process, including urging micro particles of a predefined metal to coalesce into a solid form between the first and second substrates through heating at a temperature of 300 Celsius for one hour; and
the first sintered layer has a melting point of 900 degrees Celsius.

3. The assembly of claim 2, wherein:
the first layer, the third layer, the fourth layer and the sixth layer are each composed of at least one of aluminum and copper; and
the second and the fifth layers are composed of at least one of silicon nitride, aluminum nitride and aluminum oxide.

4. The assembly of claim 1, further comprising:
a first outer member electrically connected to the first layer at a second junction, the first outer member and the first flexible structure being placed on respective opposing sides of the first semi-conductor stack; and
a second outer member electrically connected to the fourth layer at a fourth junction, the second outer member and the second flexible structure being placed on respective opposing sides of the second semi-conductor stack.

5. The assembly of claim 4, wherein the switch current defines a switching loop between the first and second terminals, the switching loop being configured to extend:
from the first terminal to the first layer;
from the first layer to the first semi-conductor stack at the first junction;
from the first semi-conductor stack to the first outer member;
from the first outer member to the first layer at the second junction;
from the first layer to the second semi-conductor stack at the third junction;
from the second semi-conductor stack to the second outer member;
from the second outer member to the unitary conducting layer at the fourth junction; and
from the unitary conducting layer to the second terminal.

6. The assembly of claim 4, wherein:
the first and second outer members have respective first, second and third sections, the respective first and third sections being parallel;
wherein the respective second sections are perpendicular to the respective first and third sections;
the first outer member has a first plurality of fingers separated by respective gaps; and
the second outer member has a second plurality of fingers separated by respective gaps.

7. The assembly of claim 4, wherein the first semi-conductor stack includes:
a first semi-conductor device, a first metal layer, a second metal layer, the first semi-conductor device being sandwiched between the first and second metal layers;
a second sintered layer positioned between the first metal layer and the first semi-conductor device; and
a third sintered layer positioned between the second metal layer and the first semi-conductor device.

8. The assembly of claim 7, wherein the first semi-conductor stack further includes:
a fourth sintered layer positioned between the first outer member and the first metal layer; and
a fifth sintered layer positioned between the second metal layer and the first layer of the first substrate.

9. The assembly of claim 4, wherein the second semi-conductor stack includes:
a second semi-conductor device, a first metal layer, a second metal layer, the second semi-conductor device being sandwiched between the first and second metal layers;
a second sintered layer positioned between the first metal layer and the second semi-conductor device; and a third sintered layer positioned between the second metal layer and the second semi-conductor device.

10. The assembly of claim 9, wherein the second semi-conductor stack further includes:
a fourth sintered layer positioned between the second outer member and the first metal layer; and
a fifth sintered layer positioned between the second metal layer and the first layer of the first substrate.

11. The assembly of claim 1
wherein the first flexible structure has a plurality of co-extending layers, including a first gate layer, a second source layer and a third drain layer;
wherein the first gate layer, the second source layer and the third drain layer are electrically isolated from one another; and
wherein the first gate layer and the second source layer are configured such that a gate current flows in the first gate layer in a third direction and a source current flows in the second source layer in a fourth direction, the fourth direction being opposite to the third direction.

12. The assembly of claim 11, wherein:
the switch current defines a switching loop through a first reference plane;
the gate current and the source current define a control loop in a second reference plane; and
the first reference plane is perpendicular to the second reference plane.

* * * * *